United States Patent
Ishibashi et al.

(10) Patent No.: US 9,971,982 B2
(45) Date of Patent: May 15, 2018

(54) MANUFACTURING LINE SIMULATION DEVICE, DATA INPUT ASSISTANCE DEVICE, AND DATA INPUT ASSISTANCE METHOD

(71) Applicant: Hitachi, Ltd., Tokyo (JP)

(72) Inventors: Hisaya Ishibashi, Tokyo (JP); Hideaki Suzuki, Tokyo (JP); Satoshi Nagahara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 977 days.

(21) Appl. No.: 14/362,981

(22) PCT Filed: Nov. 1, 2012

(86) PCT No.: PCT/JP2012/078279
§ 371 (c)(1),
(2) Date: Jun. 5, 2014

(87) PCT Pub. No.: WO2013/084628
PCT Pub. Date: Jun. 13, 2013

(65) Prior Publication Data
US 2015/0032497 A1    Jan. 29, 2015

(30) Foreign Application Priority Data
Dec. 6, 2011    (JP) .................................. 2011-266385

(51) Int. Cl.
*G06F 17/50*    (2006.01)
*G06F 7/60*    (2006.01)
(Continued)

(52) U.S. Cl.
CPC ... *G06Q 10/06375* (2013.01); *G06F 17/5009* (2013.01); *G06Q 10/063* (2013.01);
(Continued)

(58) Field of Classification Search
CPC ............ G06Q 10/06375; G06Q 10/063; G06Q 50/04; G06F 17/5009; Y02P 90/30; Y02T 10/82
(Continued)

(56) References Cited

U.S. PATENT DOCUMENTS

| | | | |
|---|---|---|---|
| 5,572,634 A * | 11/1996 | Duluk, Jr. ............... | G06T 17/00 345/419 |
| 6,868,373 B2 * | 3/2005 | Fehn ...................... | G05B 17/02 700/28 |

(Continued)

FOREIGN PATENT DOCUMENTS

| | | |
|---|---|---|
| JP | 9-44575 A | 2/1997 |
| JP | 2001-297185 A | 10/2001 |

(Continued)

*Primary Examiner* — Juan Ochoa
(74) *Attorney, Agent, or Firm* — Baker Botts L.L.P.

(57) ABSTRACT

In a conventional manufacturing line simulation, there are a number of input items, and therefore, time is required for input. In addition, depending on the objective of the simulation, there are also parameters for which input is not required, and therefore, there is the problem of reducing the number of inputs according to the library. The present invention is configured to be provided with: a simulation library presentation unit which presents, to a user, a plurality of items of model libraries which are stored in a storage unit so as to receive specification of items of the model libraries from the user; a priority degree imparting unit which, with respect to the specified items of the model libraries, uses an input association table stored in the storage unit in order to calculate the priorities of the input items so as to present an input screen to the user on the basis of the calculated priorities; a simulation input receiving unit for receiving input of the input items on the user screen; and a duplicate data generation unit which, with respect to the duplicate items indicated in the input item association table, duplicates data that has been already received at the simulation input receiving unit.

15 Claims, 21 Drawing Sheets

(51) Int. Cl.
*G06Q 10/06* (2012.01)
*G06Q 50/04* (2012.01)

(52) U.S. Cl.
CPC ............. *G06Q 50/04* (2013.01); *Y02P 90/30* (2015.11); *Y02T 10/82* (2013.01)

(58) Field of Classification Search
USPC .......................................................... 703/13
See application file for complete search history.

(56) References Cited

U.S. PATENT DOCUMENTS

| | | | | |
|---|---|---|---|---|
| 6,996,440 | B2* | 2/2006 | Maenishi | H05K 13/0452 29/740 |
| 7,136,825 | B2* | 11/2006 | Araki | G06Q 10/06311 705/7.16 |
| 8,117,211 | B2* | 2/2012 | Yamamoto | G06F 17/30867 707/749 |
| 8,185,422 | B2* | 5/2012 | Yurekli | G06Q 10/06 705/7.11 |
| 8,655,705 | B2* | 2/2014 | Riepshoff | G06Q 10/06316 705/348 |
| 2008/0133309 | A1* | 6/2008 | Maggio | G06Q 10/06 705/7.26 |

FOREIGN PATENT DOCUMENTS

| | | |
|---|---|---|
| JP | 2004-280719 A | 10/2004 |
| JP | 2007-86842 A | 4/2007 |

\* cited by examiner

FIG.3

| PRODUCT NUMBER | WORKING PROCESS ROUTE NUMBER | DUE DATE OF DELIVERY | DELIVERY DESTINATION |
|---|---|---|---|
| AA0254 | 021 | 2009/07/10 | CORPORATION A |
| AA0220 | 022 | 2009/07/11 | CORPORATION B |
| AA0321 | 103 | 2009/07/11 | CORPORATION C |
| AA0110 | 280 | 2009/07/12 | CORPORATION D |
| AA0184 | 069 | 2009/07/12 | CORPORATION E |
| : | : | : | : |

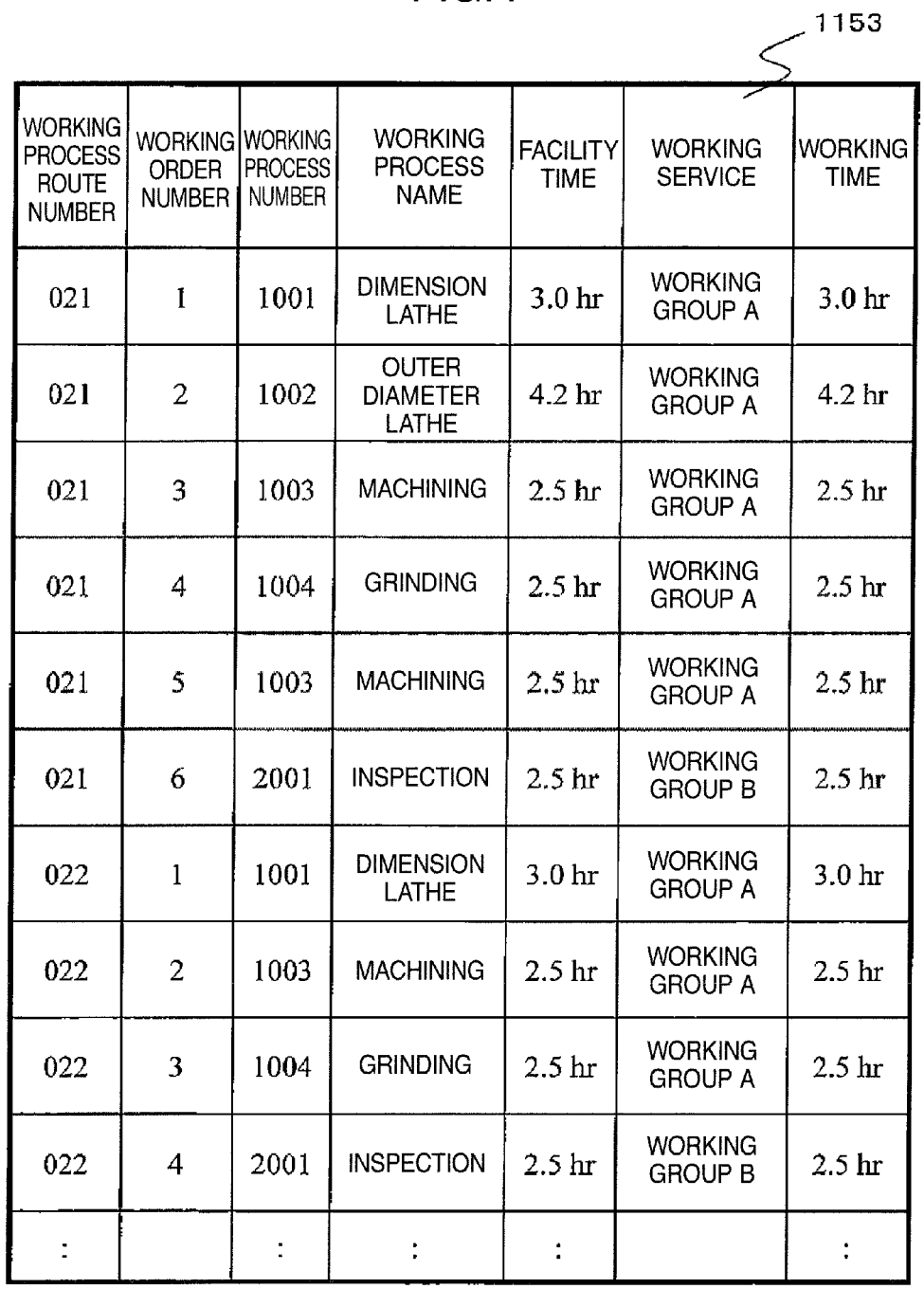

| WORKING PROCESS ROUTE NUMBER | WORKING ORDER NUMBER | WORKING PROCESS NUMBER | WORKING PROCESS NAME | FACILITY TIME | WORKING SERVICE | WORKING TIME |
|---|---|---|---|---|---|---|
| 021 | 1 | 1001 | DIMENSION LATHE | 3.0 hr | WORKING GROUP A | 3.0 hr |
| 021 | 2 | 1002 | OUTER DIAMETER LATHE | 4.2 hr | WORKING GROUP A | 4.2 hr |
| 021 | 3 | 1003 | MACHINING | 2.5 hr | WORKING GROUP A | 2.5 hr |
| 021 | 4 | 1004 | GRINDING | 2.5 hr | WORKING GROUP A | 2.5 hr |
| 021 | 5 | 1003 | MACHINING | 2.5 hr | WORKING GROUP A | 2.5 hr |
| 021 | 6 | 2001 | INSPECTION | 2.5 hr | WORKING GROUP B | 2.5 hr |
| 022 | 1 | 1001 | DIMENSION LATHE | 3.0 hr | WORKING GROUP A | 3.0 hr |
| 022 | 2 | 1003 | MACHINING | 2.5 hr | WORKING GROUP A | 2.5 hr |
| 022 | 3 | 1004 | GRINDING | 2.5 hr | WORKING GROUP A | 2.5 hr |
| 022 | 4 | 2001 | INSPECTION | 2.5 hr | WORKING GROUP B | 2.5 hr |
| : | : | : | : | : | | : |

FIG.5

| FACILITY NUMBER | FACILITY NAME | WORKING PROCESS NUMBER | SHIFT |
|---|---|---|---|
| FACILITY 1 | LATHE A | 1001 | SHIFT 1 |
| FACILITY 2 | LATHE B | 1001 | SHIFT 1 |
| FACILITY 3 | LATHE C | 1002 | SHIFT 1 |
| FACILITY 4 | MACHINING CENTER A | 1003 | SHIFT 1 |
| FACILITY 4 | GRINDER | 1004 | SHIFT 1 |
| : | : | | |

| WORKING SERVICE | THE NUMBER OF PERSONS | SHIFT |
|---|---|---|
| WORKING GROUP A | 10 | SHIFT 2 |
| WORKING GROUP B | 2 | SHIFT 2 |
| WORKING GROUP C | 11 | SHIFT 3 |
| : | : | : |

| SHIFT | START | END | BREAK |
|---|---|---|---|
| SHIFT 2 | 8:45 | 17:15 | - |
| SHIFT 2 | 8:45 | 17:15 | 12:00-12:45 |
| SHIFT 3 | 18:00 | 2:30 | 22:15-23:00 |
| ⋮ | ⋮ | ⋮ | |

| FACILITY NUMBER | PRODUCT NUMBER | PREPARATION CHANGE TIME |
|---|---|---|
| FACILITY 1 | AA0254 | 0:30 |
| FACILITY 1 | AA0220 | 0:15 |
| FACILITY 1 | AA0321 | 0:20 |
| ⋮ | ⋮ | ⋮ |

FIG.9

| NUMBER | LIBRARY ITEM | TABLE | ITEM |
|---|---|---|---|
| 6 | PREPARATION CHANGE | PRODUCT INFORMATION | PRODUCT NUMBER |
| 6 | PREPARATION CHANGE | PROCESS ROUTE INFROMATION | PROCESS ROUTE NUMBER |
| 6 | PREPARATION CHANGE | PROCESS ROUTE INFROMATION | WORKING NUMBER ORDER |
| 6 | PREPARATION CHANGE | PROCESS ROUTE INFROMATION | WORKING PROCESS NUMBER |
| 6 | PREPARATION CHANGE | FACILITY INFORMATION | FACILITY NUMBER |
| 6 | PREPARATION CHANGE | PREPARATION CHANGE INFORMATION | FACILITY NUMBER |
| 6 | PREPARATION CHANGE | PREPARATION CHANGE INFORMATION | PRODUCT NUMBER |
| : | : | : | |

| INPUT SCREEN | INPUT ITEM | PRODUCT | | PROCESS | | | FACILITIES | | | WORKER | | SHIFT | PREPARATION | |
|---|---|---|---|---|---|---|---|---|---|---|---|---|---|---|
| | | PRODUCT NUMBER | PROCESS ROUTE | PROCESS ROUTE | PROCESS NUMBER | WORKING NAME | FACILITY NAME | PROCESS NUMBER | SHIFT | WORKING NAME | SHIFT | SHIFT | FACILITY NAME | PRODUCT NUMBER |
| PRODUCT | PRODUCT NUMBER | | | | | | | | | | | | | 2 |
| PRODUCT | PROCESS ROUTE | | | 2 | | | | | | | | | | |
| PROCESS | PROCESS ROUTE | | 1 | | | | | | | | | | | |
| PROCESS | PROCESS NUMBER | | | | | | | 2 | | | | | | |
| PROCESS | WORKING SERVICE | | | | | | | | | 2 | | | | |
| FACILITIES | FACILITY NAME | | | | | | | | | | | | 2 | |
| FACILITIES | PROCESS NUMBER | | | | 1 | | | | | | | | | |
| FACILITIES | SHIFT | | | | | | | | | | 1 | 1 | | |
| WORKER | WORKING SERVICE | | | | | 1 | | | | | | | | |
| WORKER | SHIFT | | | | | | | | 1 | | 1 | | | |
| SHIFT | SHIFT | | | | | | | | 2 | | 2 | | | |
| PREPARATION | FACILITY NAME | | | | | | 1 | | | | | | | |
| PREPARATION | PRODUCT NUMBER | 1 | | | | | | | | | | | | |

| LIBRARY | INPUT ITEM | PRODUCT | | PROCESS | | | FACILITIES | | WORKER | | SHIFT | PREPARATION | | PRIORITY |
|---|---|---|---|---|---|---|---|---|---|---|---|---|---|---|
| | | PRODUCT NUMBER | PROCESS ROUTE | PROCESS ROUTE | PROCESS NUMBER | WORKING NAME | FACILITY NAME | PROCESS NUMBER | SHIFT | WORKING NAME | SHIFT | FACILITY NAME | PART NUMBER | |
| PRODUCT | PART NAME | | | | | | | | | | | | | |
| | PROCESS ROUTE | | 2 | | | | | | | | | | | 2.0 |
| PROCESS | PROCESS ROUTE | 1 | | | | | | | | | | | | |
| | PROCESS NUMBER | | | | | | 2 | | | | | | | 5.0 |
| | WORKING SERVICE | | | | | | | | | 2 | | | | |
| FACILITIES | FACILITY NAME | | | | | | | | | | | | | |
| | PROCESS NUMBER | | | | 2 | | | | | | | | | 4.0 |
| | SHIFT | | | | | | | | 1 | | 1 | | | |
| WORKER | WORKING SERVICE | | | | | 1 | | | | | | | | 3.0 |
| | SHIFT | | | | | | | | 1 | | 1 | | | |
| SHIFT | SHIFT | | | | | | | | 2 | | 2 | | | 4.0 |
| PREPARATION | FACILITY NAME | | | | | | | | | | | | | 0 |
| | PART NAME | | | | | | | | | | | | | |

[DETERMINE]

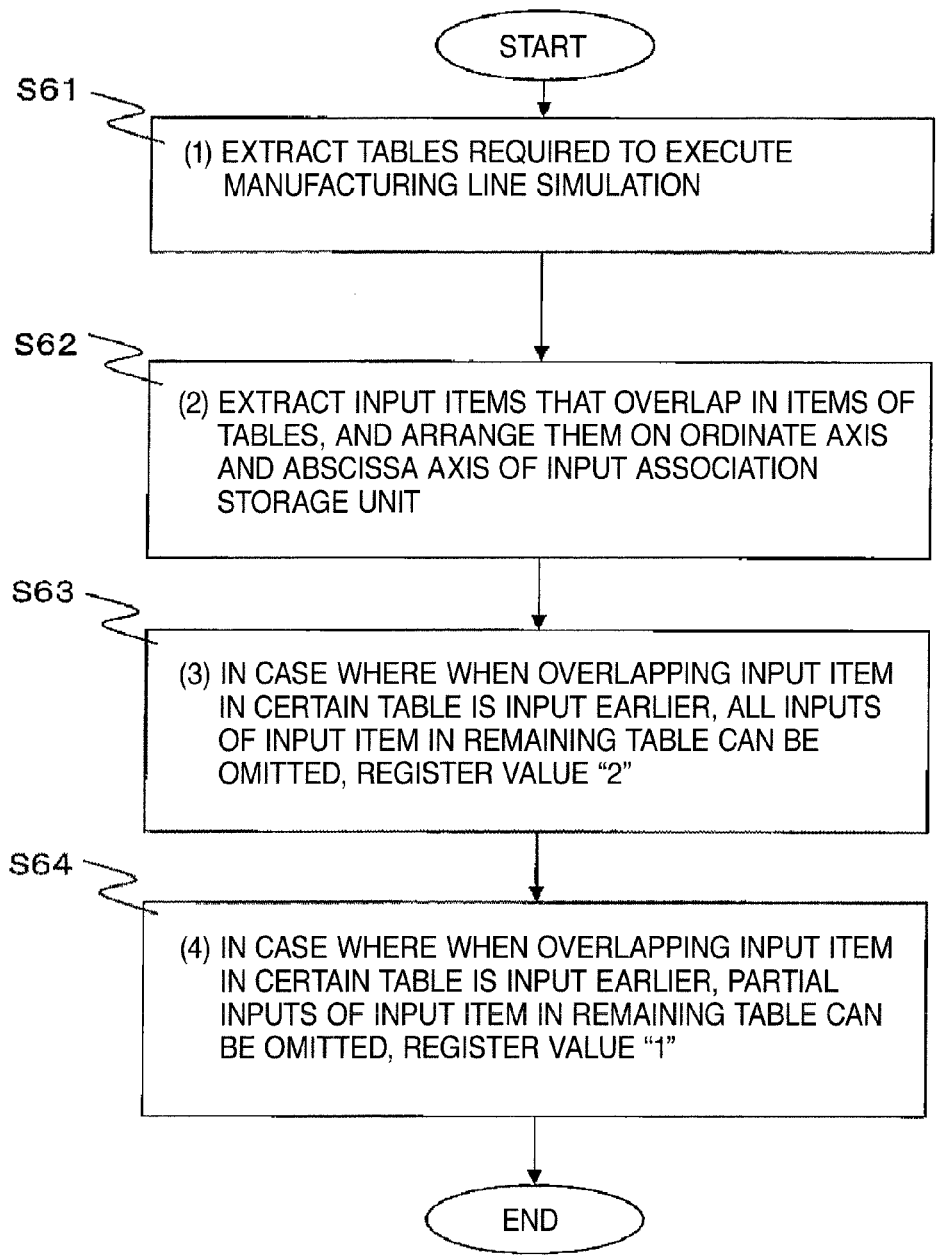

MANUFACTURING LINE SIMULATION DEVICE, DATA INPUT ASSISTANCE DEVICE, AND DATA INPUT ASSISTANCE METHOD

TECHNICAL FIELD

The present invention relates to a manufacturing line design of an industrial machine, a motor, a turbine or the like. In particular, the present invention relates to a technical field of a manufacturing line simulation device for automatically creating a manufacturing line simulation model which becomes input data of manufacturing line simulation conducted to previously verify behavior of a manufacturing line.

BACKGROUND ART

As a technique for evaluating a production quantity and the number in process in manufacturing line design, there is manufacturing line simulation. For utilizing the manufacturing line simulation, facilities, workers and transport equipment which are components of the manufacturing line are first formed into a model on a computer. In a conventional manufacturing line simulation, a model in the manufacturing line simulation is constructed by creating libraries of models created in past simulation and combining libraries in accordance with requirements of the simulation.

For example, in Patent Literature 1, a technique of automatically selecting a library corresponding to process information that is input by a manufacturing line designer from libraries of past simulation is stated.

CITATION LIST

Patent Literature

PATENT LITERATURE 1: JP-A-2004-280719

SUMMARY OF INVENTION

Technical Problem

In Patent Literature 1, a technique of constructing a manufacturing line simulation model by creating libraries of past simulation cases and combining libraries in accordance with requirements of simulation is stated. However, there are a large number of input items of manufacturing line simulation such as working hours, a process route, a shift, and the number of persons that are input to library items of a process, facilities, and workers. It takes a much man-hour to input all items. Furthermore, overlapping input of a common input item is conducted for library items. Therefore, it is a subject to reduce man-hour required for inputting by generating an input sequence implementing minimum input and eliminating overlapping input.

Therefore, it is an object of the present invention to provide means that implements reduction of man-hour required to create input items by systematizing the library input procedure and saving labor in overlapping input procedure in manufacturing line simulation intended for design of a manufacturing line.

Solution to Problem

In order to solve the subject, for example, a configuration stated in claims is adopted. The present application includes means that solves the subject. An example thereof is a manufacturing line simulation device using a manufacturing line model having a configuration including a storage unit for storing a plurality of model library items for creating a manufacturing line model, a storage unit for storing input items in the model library items, and an input item association table indicating a degree of overlapping between input items in the model library items, a simulation library presentation unit for presenting the plurality of model library items stored in the storage unit to a user and receiving specification of a model library item from the user, a priority impartment unit for calculating priorities of the input items by using the input association table stored in the storage unit and presenting an input screen to the user on the basis of the calculated priorities, a simulation input reception unit for receiving an input of an input item on the input screen, an overlapping data generation unit for duplicating data already received in the simulation input reception unit with respect to overlapping items shown in the input item association table, a simulation model generation unit for generating a manufacturing line simulation model by using the specified model library item and an information value of the input item which is received by the simulation input reception unit, and a production simulation execution unit for executing simulation by using the simulation model.

Advantageous Effects of Invention

According to the present invention, it becomes possible to reduce input man-hour in manufacturing line simulation. Subjects, configurations and effects other than those described above will be made clear by ensuing description of embodiments.

BRIEF DESCRIPTION OF DRAWINGS

FIG. 3 is a diagram showing product information which is an embodiment of the present invention.

FIG. 4 is a diagram showing process route information which is an embodiment of the present invention.

FIG. 5 is a diagram showing facility information which is an embodiment of the present invention.

FIG. 6 is a diagram showing worker information which is an embodiment of the present invention.

FIG. 7 is a diagram showing shift information which is an embodiment of the present invention.

FIG. 8 is a diagram showing preparation information which is an embodiment of the present invention.

FIG. 9 is a diagram showing library—input item association table information which is an embodiment of the present invention.

FIG. 10 is a diagram showing input item association table information which is an embodiment of the present invention.

FIG. 16 shows an output result of a manufacturing line simulation input sequence creation device which is an embodiment of the present invention.

FIG. 23 is a flow chart for creating input item association table information in an embodiment of the present invention.

DESCRIPTION OF EMBODIMENTS

Hereafter, an embodiment of the present invention will be described.

Figure 1:
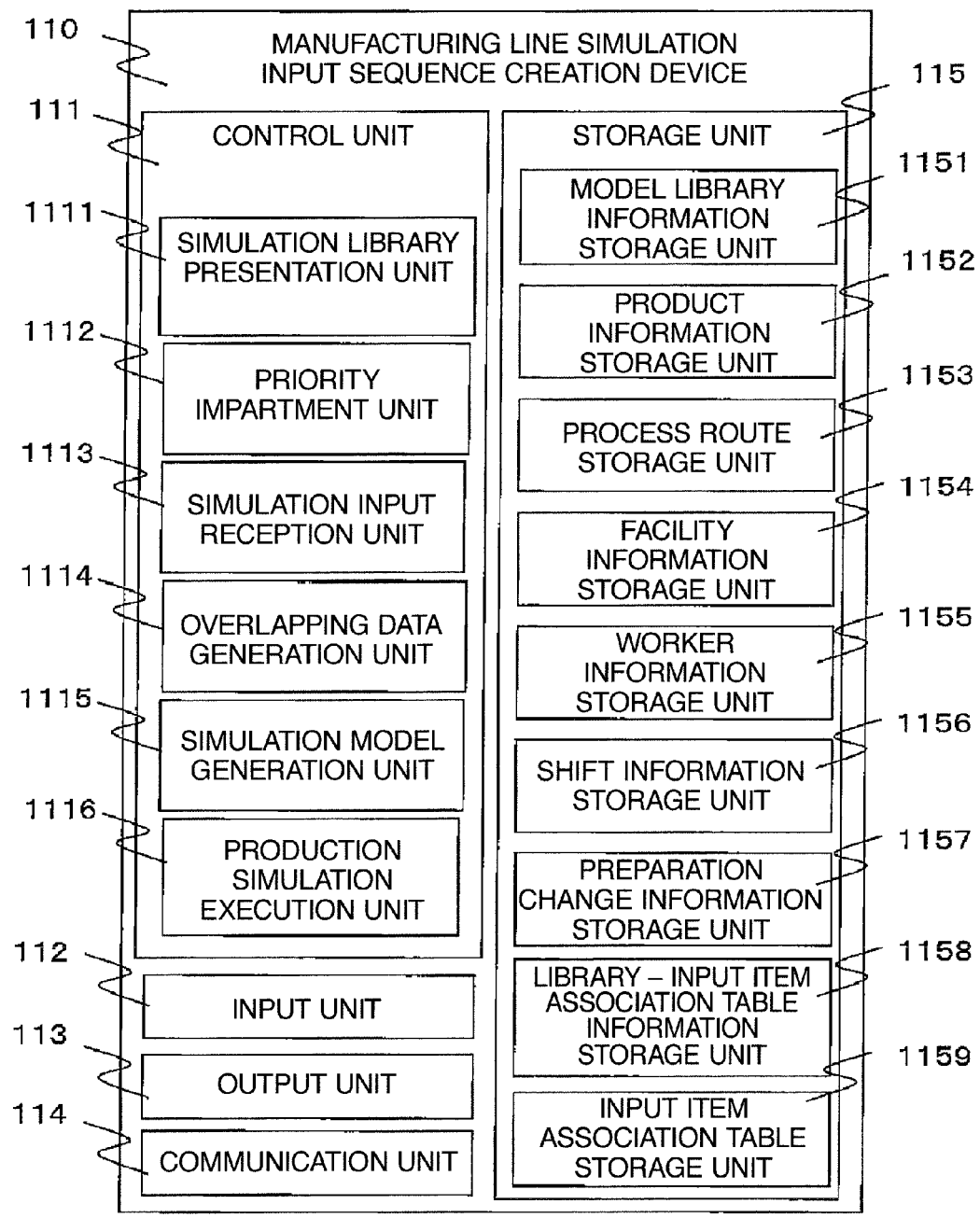
FIG. 1 is a diagram showing a schematic diagram of a manufacturing line simulation input sequence creation device which is an embodiment of the present invention.

FIG. 1 is a schematic diagram of a manufacturing line simulation input sequence creation device 110. As illustrated, the manufacturing line simulation input sequence creation device 110 includes a control unit 111, an input unit 112, an output unit 113, a communication unit 114, and a storage unit 115. Furthermore, the control unit 111 includes a simulation library presentation unit 1111, a priority impartment unit 1112, a simulation input reception unit 1113, an overlapping data generation unit 1114, a simulation model generation unit 1115, and a production simulation execution unit 1116.

The input unit 112 receives an information input. The output unit 113 outputs information. The communication unit 114 transmits and receives information via a network 190. The storage unit 115 includes model library information 1151, a product information storage unit 1152, a process route information storage unit 1153, a facility information storage unit 1154, a worker information storage unit 1155, a shift information storage unit 1156, a preparation storage unit 1157, a library—input item association table storage unit 1158, and an input association table storage unit 1159.

Figure 2:
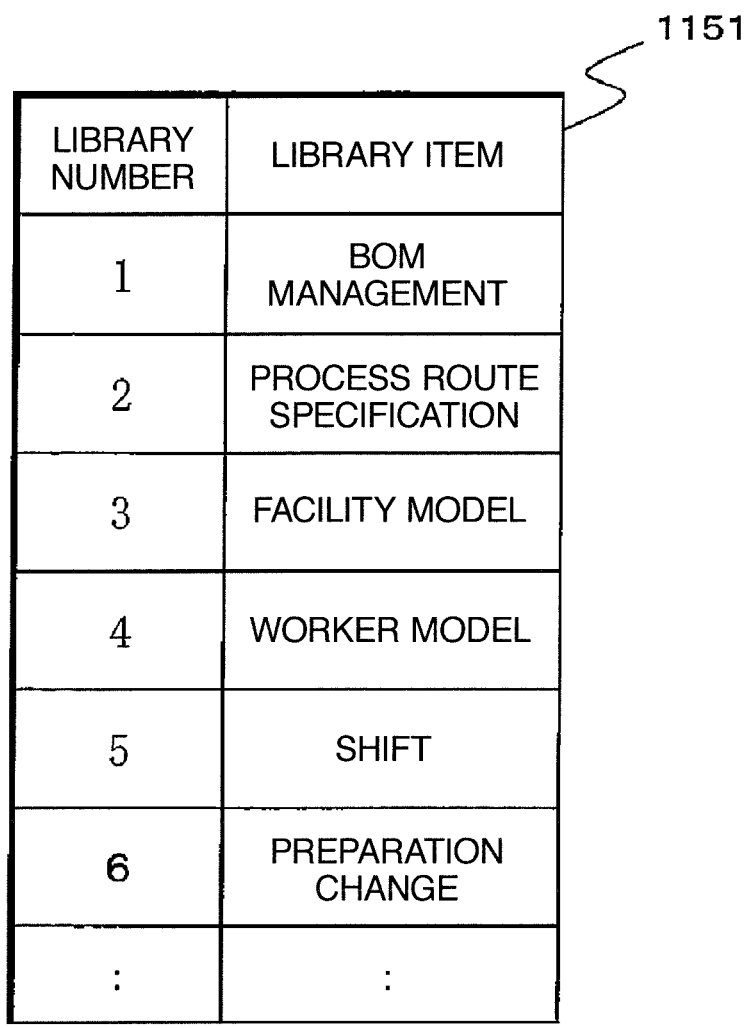
FIG. 2 is a diagram showing model library information which is an embodiment of the present invention.

FIG. 2 is a diagram representing an embodiment of a file format of the model library information 1151 stated in FIG. 1. In FIG. 2, the file format 1151 includes a field for registering a library number which is an identification number of a model library, and a field for registering a library item which indicates a function of manufacturing line simulation.

FIG. 3 is a diagram representing an embodiment of a file format of the product information storage unit 1152. In FIG. 3, the file format 1152 includes a field for registering a product number which is an identification number allocated when an order is received from a delivery destination who is a customer, a field for registering a working process route number which is an identification number of a working process route, a field for registering a due date of delivery when the product is to be shipped to the delivery destination, and a field for registering a delivery destination of a customer.

FIG. 4 is a diagram representing an embodiment of a file format of the working process route information storage unit 1153. In FIG. 4, the file format 1153 includes a field for registering a working process route number which is an identification number of a working process route, a field for registering a working order number which indicates an order of working in the working process route number, a field for registering a working process number which indicates an identification number of a working process, a field for registering a working process number which indicates an identification number of a working process, a field for registering a working process name which indicates a name of a working process, a field for registering facility time required to process the pertinent working process number in facilities, a field for registering worker service in a case where a worker is needed in the pertinent working process number, and a field for registering working time required for a worker to conduct working in the pertinent working process number.

FIG. 5 is a diagram representing an embodiment of a file format of the facility information storage unit 1154 stated in FIG. 1. In FIG. 5, the file format 1154 includes a field for registering a facility number, a field for registering a facility name of pertinent facilities, a field for registering a working process number, and a field for registering a shift which is a name of a working period in which the facilities can operate.

FIG. 6 is a diagram representing an embodiment of a file format of the worker information storage unit 1155 stated in FIG. 1, In FIG. 5, the file format 1154 includes a field for registering a name of a worker service in a case where workers are needed in the working process number, a field for registering the number of workers who can work in the pertinent working service, and a field for registering a shift which is a name of a working period for which workers of the pertinent working service can work.

FIG. 7 is a diagram representing an embodiment of a file format of the shift information storage unit 1156 stated in FIG. 1. In FIG. 7, the file format 1156 includes a field for registering a shift which is a name of a working period for which facilities or workers can operate, a field for registering start time of the working period, a field for registering end time of the working period, and a field for registering a break time in the working time.

FIG. 8 is a diagram representing an embodiment of a file format of the preparation change information storage unit 1157 stated in FIG. 1. In FIG. 8, the file format 1157 includes a field for registering a facility number, a field for registering a product number which is an identification number allocated when an order is received from a delivery destination who is a customer, and a field for registering a preparation change time required for a preparation change at the time of pertinent facilities and pertinent product number.

FIG. 9 is a diagram representing an embodiment of a file format of the library—input item association table information 1158. In FIG. 9, the file format 1158 includes a field for registering a library number which is an identification number of a model library, a field for registering a library item which indicates a function of the manufacturing line simulation, a field for registering a table required to execute the pertinent model library, and a field for registering an input item required to execute the pertinent model library.

FIG. 10 is a diagram representing an embodiment of a file format of the input item association table information 1159. In the input item association table information 1159, table information and input items required to execute simulation are registered in the ordinate axis and abscissa axis as a two-dimensional table, and degrees of overlapping between input items are registered as input values. FIG. 23 is an example of a flow chart for creating the input item association table information 1159 shown in FIG. 10. First, (1) tables required to execute manufacturing line simulation are extracted (S61). For example, in the example shown in FIG. 10, the product information storage unit 1152, the process route information storage unit 1153, the facility information storage unit 1154, the worker information storage unit 1155, the shift information storage unit 1156, and the preparation storage unit 1157 described with reference to FIGS. 3 to 8 are extracted. Then, (2) input items that overlap in items of the tables are extracted and arranged on the ordinate axis and the abscissa axis of the input association storage unit (S62). For example, in the example shown in FIG. 10, input items having an overlapping relation are extracted from among input items of the product information storage unit 1152, the process route information storage unit 1153, the facility information storage unit 1154, the worker information storage unit 1155, the shift information storage unit 1156, and the preparation storage unit 1157 described with reference to FIGS. 3 to 8. For example, the product number in the product information storage unit 1152 and the product number in the preparation storage unit 1157 overlap each other, the product number is registered. In the same way, input items having an overlapping relation are extracted from among other input items as well.

Then, degrees of overlapping between input items are registered as input values. In this example, the degree of overlapping is defined in two stages in order to provide priority with a weight according to an inclusion relation between input items. (3) In a case where when an overlapping input item in a certain table is input earlier, all inputs of the input item in a remaining table can be omitted, a value "2" is registered (S63). Furthermore, (4) in a case where when an overlapping input item in a certain table is input earlier, partial inputs of the input item in a remaining table can be omitted, a value "1" is registered (S64). For example, in a case where the product number in the product information storage unit 1152 is input earlier than the product number in the preparation storage unit 1157, all product numbers in the preparation storage unit 1157 can be input. In this case, therefore, the value "2" is registered. In the table in FIG. 10, "2" is input to a place of product number in preparation change information in a thirteenth column in product number in product information in a first row. On the other hand, in a case where the product number in the preparation storage unit 1157 is input earlier than the product number in the product information storage unit 1152, all product numbers in the product information storage unit 1152 are not necessarily input. In this case, therefore, the value "1" is registered. In the table in FIG. 10, "1" is input to a place of product number in product information in a first column in product number in preparation change information in a thirteenth row.

Figure 11:
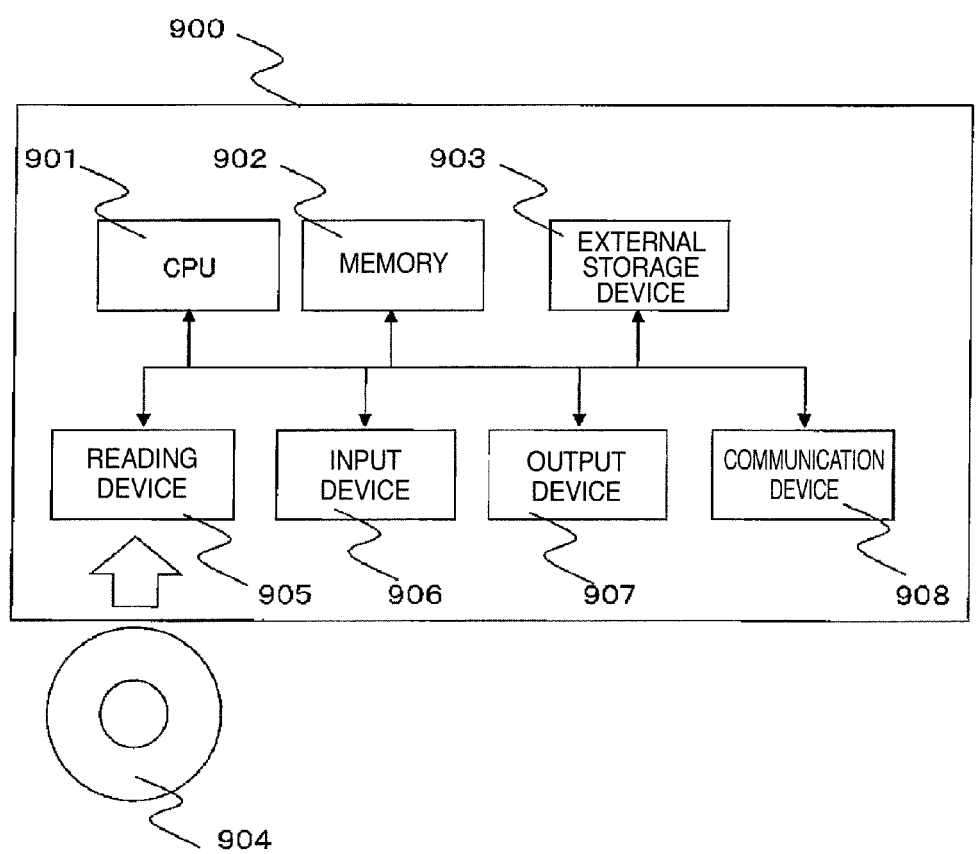
FIG. 11 is a diagram showing a hardware configuration which is an embodiment of the present invention.

The manufacturing line design device 110 can be implemented by using, for example, a general computer 900 including a CPU (Central Processing Unit) 901, a memory 902, an external storage device 903 such as an ND (Hard Disk Drive), a reading device 905 which reads and writes information on a portable storage medium 904 such as a CD (Compact Disk) or a DVD (Digital Versatile Disk), an input device 906 such as a keyboard and a mouse, an output device 907 such as a display, and a communication device 908 for connection to a communication network such as an NIC (Network Interface Card) as shown in FIG. 11 (a schematic diagram of the computer 900).

Figure 12:
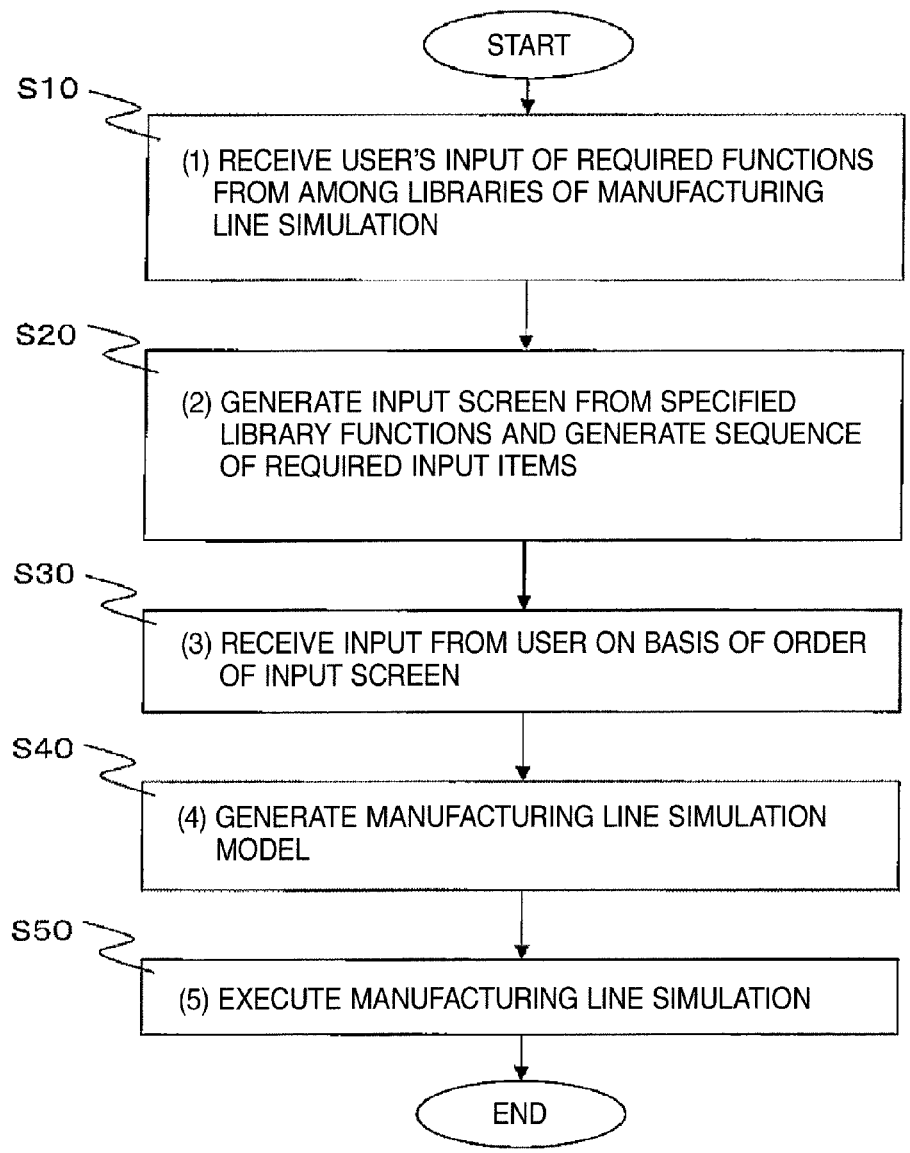
FIG. 12 is a diagram showing an operation flow of a manufacturing line simulation input sequence creation device which is an embodiment of the present invention.

Processing programs executed by the manufacturing line simulation input sequence creation device 110 according to the present invention will now be described in order with reference to FIG. 12. FIG. 12 is a flow chart showing processing that creates an input sequence for creating a model of manufacturing line simulation executed by the manufacturing line simulation input sequence creation device 110 according to the present invention.

First, the simulation library presentation unit 1111 presents library functions of manufacturing line simulation to a user, and the user specifies a required library (S10). By the way, details of the step S10 will be described with reference to FIG. 13.

Then, the priority impartment unit 1112 generates an input screen from the library specified at the step S10 and generates a sequence of required input items (S20). By the way, details of the step S20 will be described with reference to FIG. 14.

Then, the input simulation input reception unit 1113 receives an input from the user on the basis of an order of an input screen (S30). By the way, details of the step S30 will be described with reference to FIGS. 17 and 18.

Then, the simulation model generation unit 1115 generates a manufacturing line simulation model by using the library functions received by the simulation library presentation unit 1111 and a value input by the simulation input reception unit 1113 (S40).

Finally, the production simulation execution unit 1116 executes production simulation from the present time to the future by using the generated manufacturing line simulation model (S50). Details of the step S50 will be described in detail with reference to FIG. 19.

Figure 13:
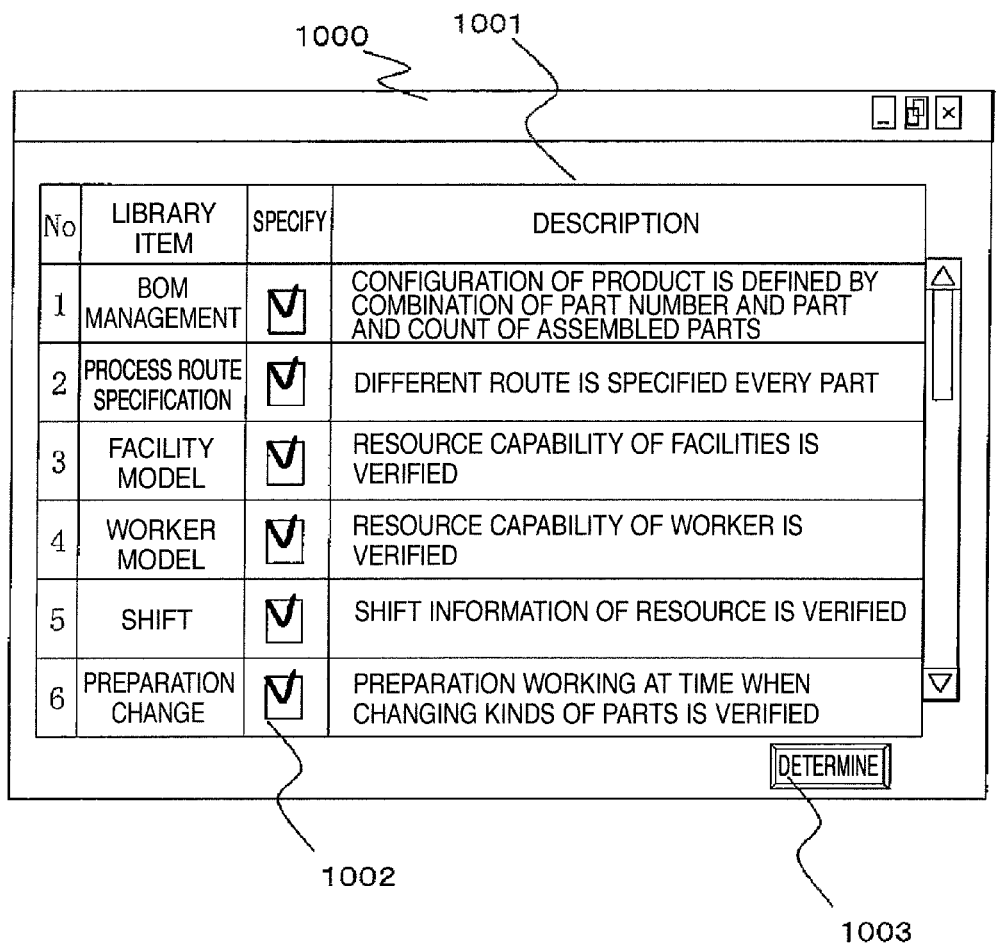
FIG. 13 shows an input screen of a manufacturing line simulation input sequence creation device which is an embodiment of the present invention.

Details of the step S10 executed by the manufacturing line simulation input sequence creation device 110 shown in FIG. 12 will now be described with reference to FIG. 13. FIG. 13 is a schematic diagram showing an example of an input screen 1000. As for the input screen 1000, the model library information 1151 in the storage unit 115 is acquired and displayed in a display item 1001. Furthermore, the input screen 1000 includes an input item 1002 represented by a check box every library information. When conducting manufacturing line simulation, the user selects necessary library functions by using the check boxes on the present screen. After finishing selection of all library functions, the user depresses a registration button 1003.

Figure 14:
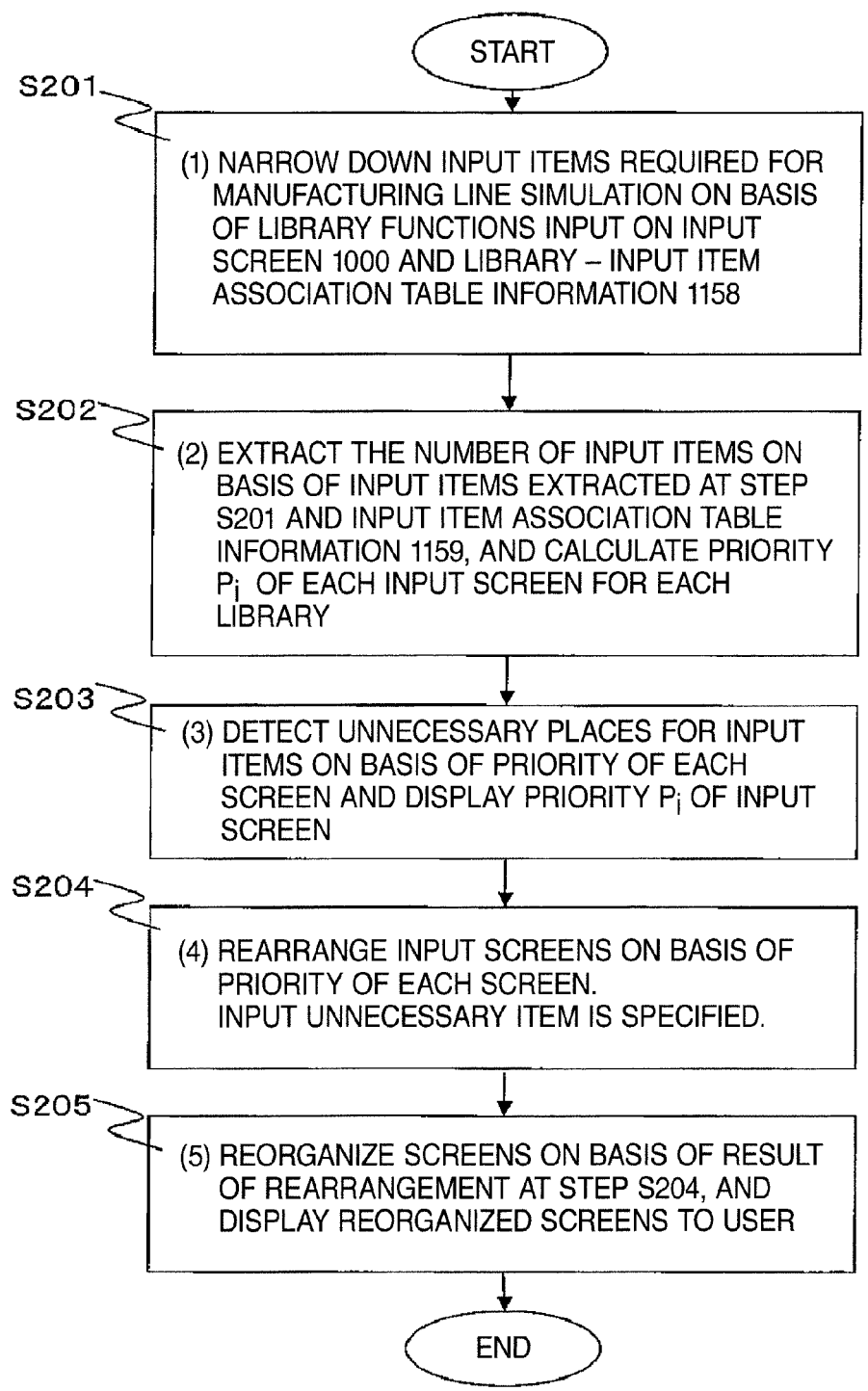
FIG. 14 is a diagram showing an operation flow of a manufacturing line simulation input sequence creation device which is an embodiment of the present invention.

FIG. 14 is a flow chart showing processing executed by the priority impartment unit 1113 at the step S20 in FIG. 12. First, the priority impartment unit 1112 narrows down input items required for the manufacturing line simulation on the basis of the library functions input on the input screen 1000 shown in FIG. 13 and the library—input item association table information 1158. For example, in a case where "preparation change function" is selected on the input screen 1000 shown in FIG. 13, the priority impartment unit 1112 extracts all input items pertinent to the "preparation change function" from the columns of the library function in the library—input item association table information 1158 shown in FIG. 9.

Then, the priority impartment unit 1112 extracts the number of input items on the basis of the input items extracted at the step S201 and the input item association table information 1159, and calculates priority of each input screen (S202). When the input screen is i and the number of input items is j, the degree of overlapping is denoted by $D_{i,j}$. At this time, priority $P_i$ of the input screen is defined by the following expression.

[MATH. 1]

[MATH. 1]

$$P_i = \sum_{i=1}^{N} \sum_{j=1}^{M_i} D_{i,j} \quad \text{(Expression 1)}$$

N: Maximum number of input screens, M: Maximum number of input items of input screen i For example, in the case of values in the input item association table information 1159 shown in FIG. 10, the degree of overlapping $D_{i,j}$ of all input items are added for two input items on the "product" input screen. As a result, the value of priority $P_i$ of the input screen becomes "4" from "2" on the "process" input screen and "2" of "product number" on the "preparation" input screen. Such a calculation is conducted on all input screens.

Figure 15:
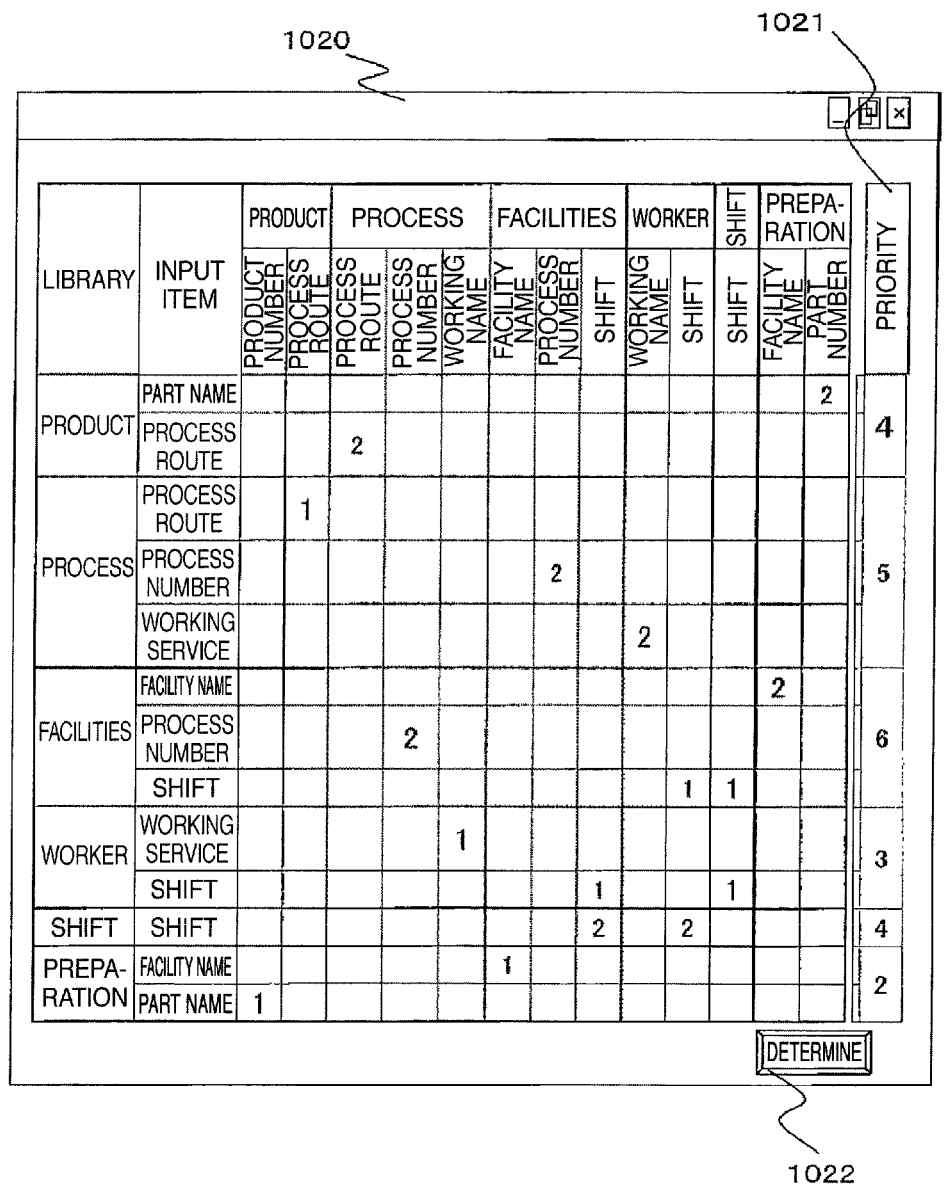
FIG. 15 shows an output result of a manufacturing line simulation input sequence creation device which is an embodiment of the present invention.

Then, the priority impartment unit 1112 detects unnecessary places for input items on the basis of the priority $P_i$ of the input screen calculated at the step S202, and displays a result (S203). FIG. 15 is an output screen showing the result of the priority $P_i$ of the input screen. In this example, a case where all library functions are selected on the input screen 1000 shown in FIG. 13 is shown. A value "4" of priority $P_i$ of the "product" input screen is displayed in a display item 1021. FIG. 16 shows a result in a case where the "preparation change" function in the library is not selected on the input screen 1000 shown in FIG. 13. In this case, for two input items on the "product" input screen, "2" in the "product number" on the "preparation" input screen is eliminated and the value of priority $P_i$ on the input screen becomes "2." The value "2" of the priority $P_i$ on the "product" input screen is displayed in a display item 1021 shown in FIG. 16.

Then, the priority impartment unit 1112 rearranges the input screens on the basis of priority of each screen (S204). Specifically, in a case where all library functions are selected on the input screen 1000 shown in FIG. 13 as in the example shown in FIG. 15, the priority impartment unit 1112 rearranges the input screens in order of "facilities," "process," "product," "shift," "worker," and "preparation" screens on the basis of the priority $P_i$. Furthermore, in a case where the "preparation change" function is not selected on the input screen 1000 shown in FIG. 13 as in the example shown in FIG. 16, the priority impartment unit 1112 rearranges the input screens in order of "process," "facilities," "worker," "product," "shift," and "preparation" screens on the basis of the priority $P_i$. Since the "preparation" screen is unnecessary, the "preparation" screen is not presented as an input screen.

Figure 17:
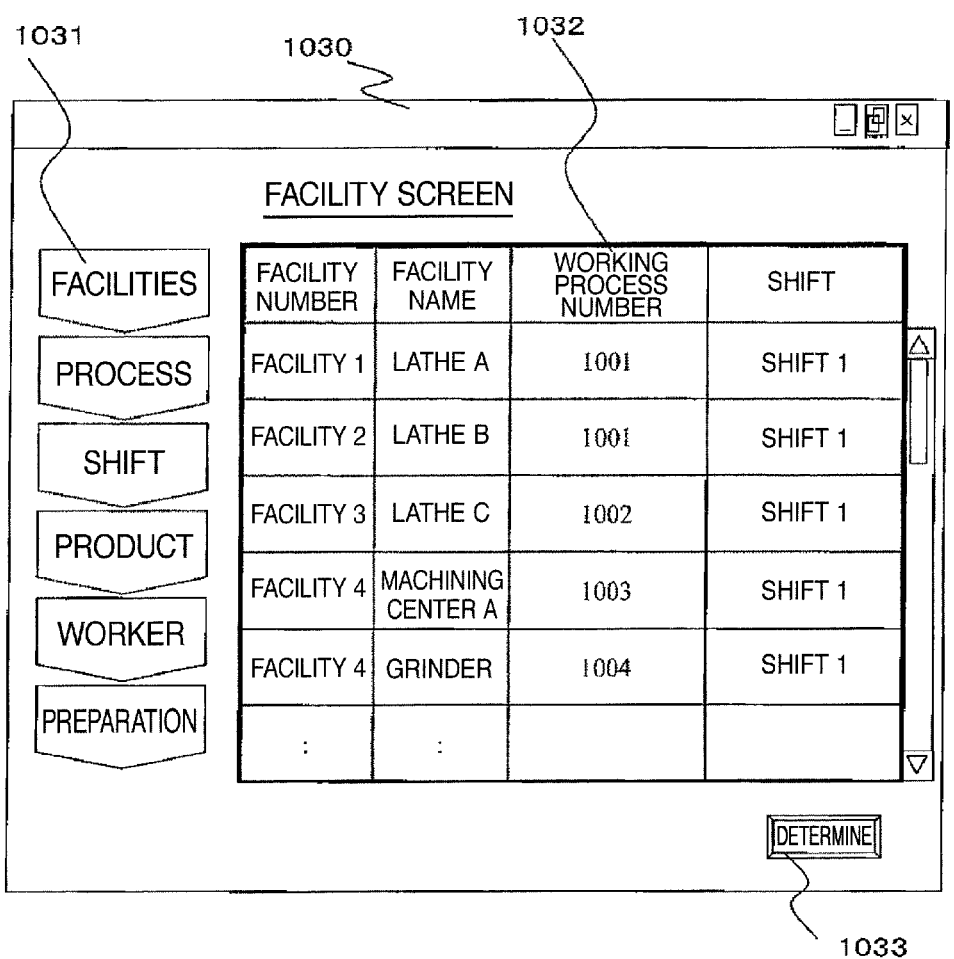
FIG. 17 shows an output result of a manufacturing line simulation input sequence creation device which is an embodiment of the present invention.
Figure 18:
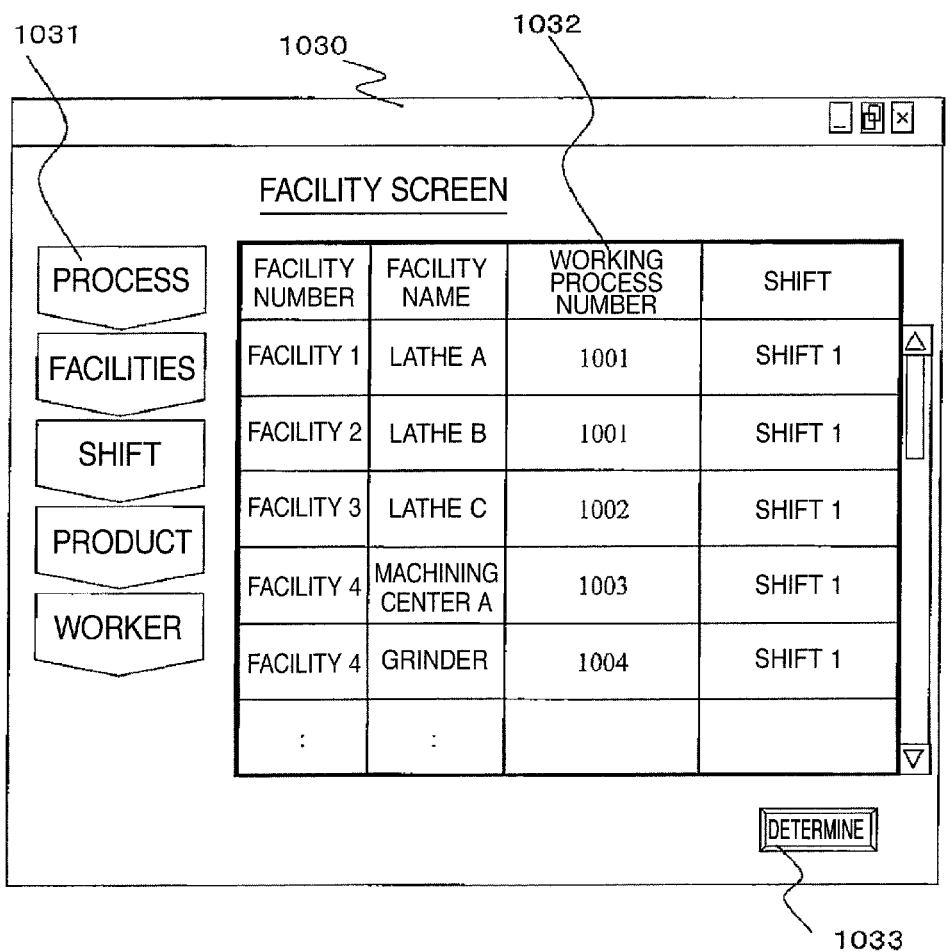
FIG. 18 shows an output result of a manufacturing line simulation input sequence creation device which is an embodiment of the present invention.

Finally, the priority impartment unit 1112 reorganizes screens on the basis of a result of rearrangement at the step S204, and displays reorganized screens to the user (S205). Specifically, an input screen in a case where all library functions are selected on the input screen 1000 shown in FIG. 13 is shown in FIG. 17. An input screen is displayed in a display item 1032 in order of "facilities," "process," "product," "shift," "worker," and "preparation" screens rearranged from a display item 1031 in order of priority at the step S204. FIG. 18 shows an input screen in a case where the "preparation change" function is not selected on the input screen 1000 shown in FIG. 13. An input screen is displayed in the display item 1032 in order of "process," "facilities," "worker," "product," and "shift" screens rearranged from the display item 1031 in order of priority at the step S204. In FIG. 17 and FIG. 18, a state in which input is conducted for the display item 1032 is shown.

Figure 19:
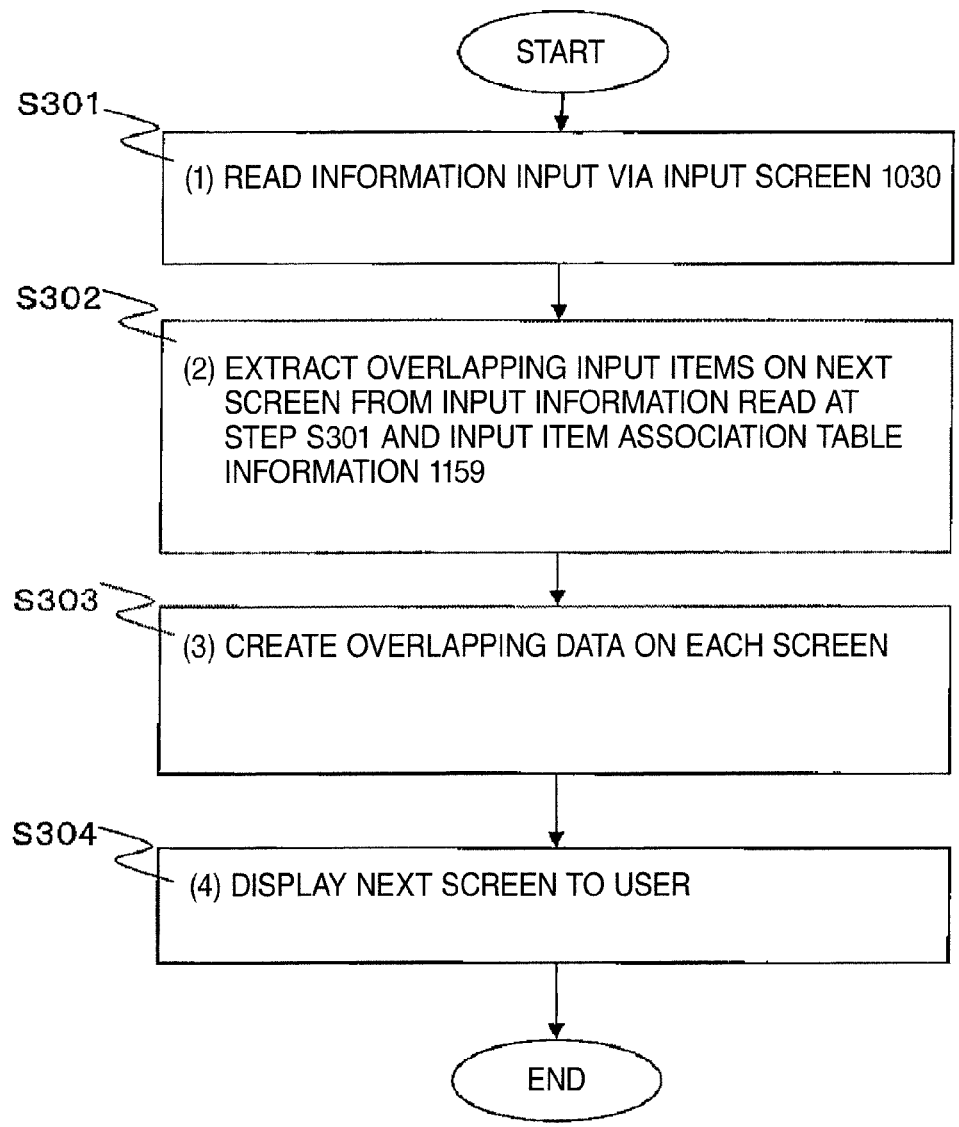
FIG. 19 is a diagram showing an operation flow of a manufacturing line simulation input sequence creation device which is an embodiment of the present invention.

Furthermore, if all input items on the "facility" screen are complete on the input screen 1030 and an execution item 1033 "determine" button is depressed, the overlapping data generation unit 1114 duplicates data input by the screen for the overlapping item. FIG. 19 is a flow chart showing processing executed by the overlapping data generation unit 1114. First, the overlapping data generation unit 1114 reads information input on the input screen 1030 (S301).

Then, the overlapping data generation unit 1114 extracts overlapping input items on the next screen from input information read at the step S301 and the input item association table information 1159 (S302). In the case of this instance, overlapping "process number" on the "process" screen subsequent to the "facility" screen is extracted.

Then, the overlapping data generation unit 1114 creates overlapping data on each screen (S303). In the case of this instance, the overlapping data generation unit 1114 creates data of "process number" on the "process" screen.

Figure 20:
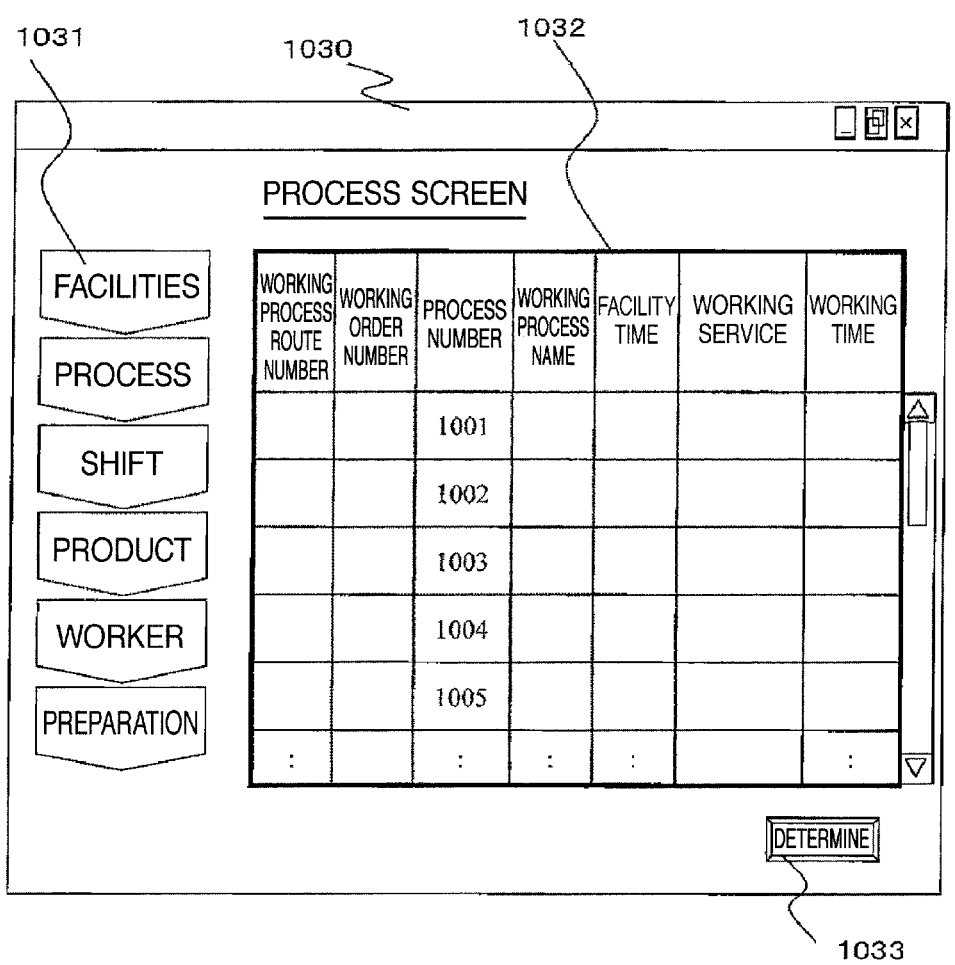
FIG. 20 shows an output result of a manufacturing line simulation input sequence creation device which is an embodiment of the present invention.

Finally, the overlapping data generation unit 1114 displays the next screen to the user (S304). Specifically, an example in which a shift from the "facilities" screen to the "process" screen is made is shown in FIG. 20. Before the user conducts inputting, overlapping data are already displayed in the "process number" on the "process" screen. Burden on the user is reduced.

Figure 21:
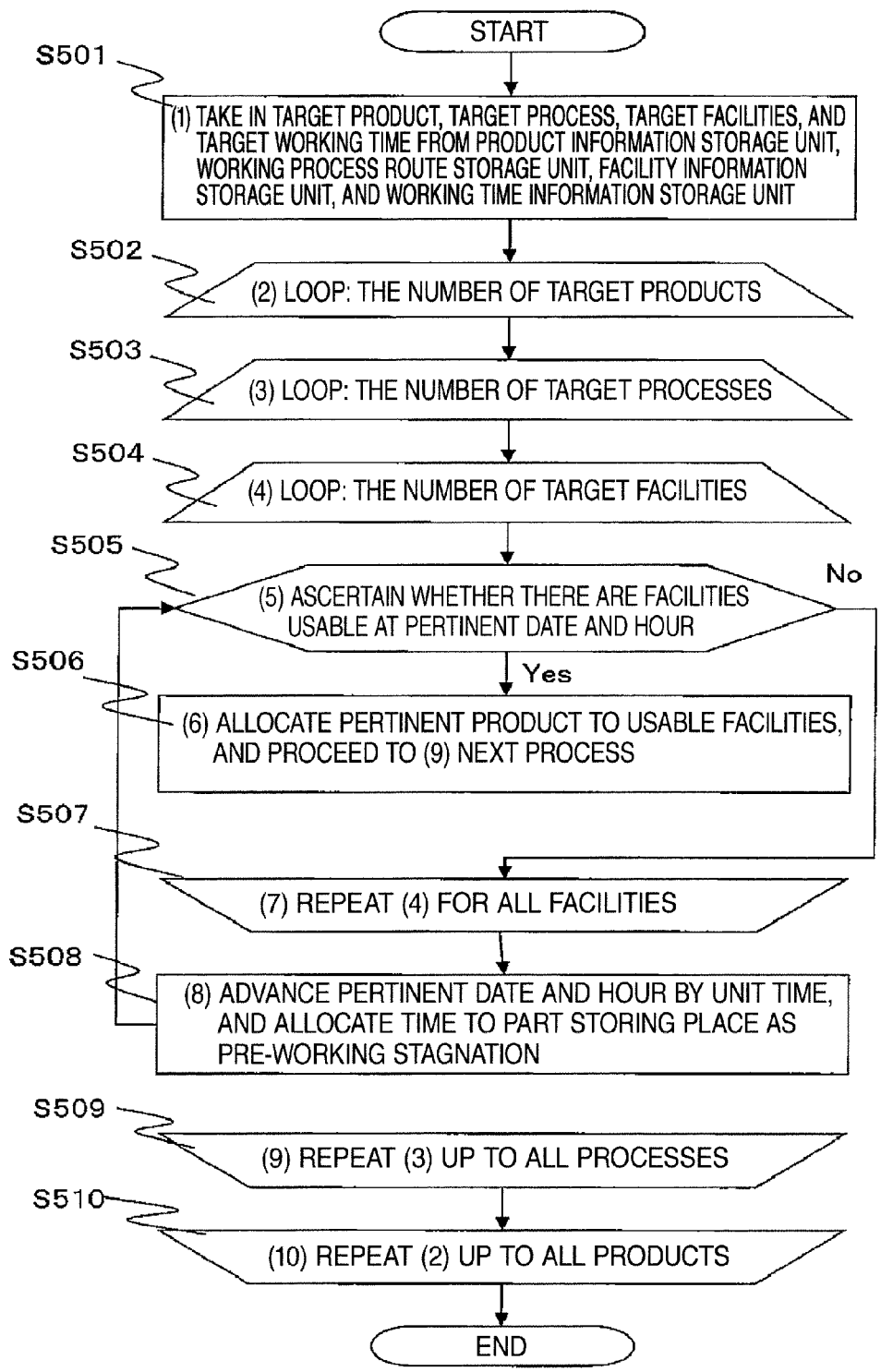
FIG. 21 is a diagram showing an operation flow of a manufacturing line simulation input sequence creation device which is an embodiment of the present invention.

FIG. 21 is a flow chart showing processing of executing production simulation at the step S50 shown in FIG. 12. First, the production simulation execution unit 1116 takes in a target product, a target process, target facilities, and target working time from the product information storage unit 1152, the process mute information storage unit 1153, the facility information storage unit 1154, the worker information storage unit 1155, the shift information storage unit 1156, and the preparation storage unit 1157 stored in the storage unit 115 (S501).

Then, the production simulation execution unit 1116 repeats processing steps S503 to S509 as many times as the number of all products in order to make plans of all products stored in the product information storage unit 1152 (S502).

Then, the production simulation execution unit 1116 repeats processing steps S504 to S208 as many times as the number of all processes in order to make a plan of the target product (S503).

Then, the production simulation execution unit 1116 repeats processing steps S205 to S206 the number of facilities pertinent to the target process (S504).

Then, the production simulation execution unit 1116 ascertains whether there are facilities usable at the pertinent date and hour of the target product and target process (S505).

If there are usable facilities, the production simulation execution unit 1116 proceeds to step S506, allocates the pertinent product to usable facilities by working hours at pertinent date and hour, proceeds to step S503, and makes the next process a target (S506).

If there are no usable facilities, the production simulation execution unit 1116 proceeds to step S507, and repeats for all target facilities. If there are no usable facilities in all facilities, the production simulation execution unit 1116 proceeds to step S508, advances the pertinent date and hour by unit time (S508), and proceeds to step S505.

The production simulation execution unit 1116 repeats the processing steps S504 to S508 by the number of all processes in order to make a plan of the target product (S509), and repeats the processing steps S503 to S509 by the number of all processes in order to make plans of all target products (S510).

Figure 22:
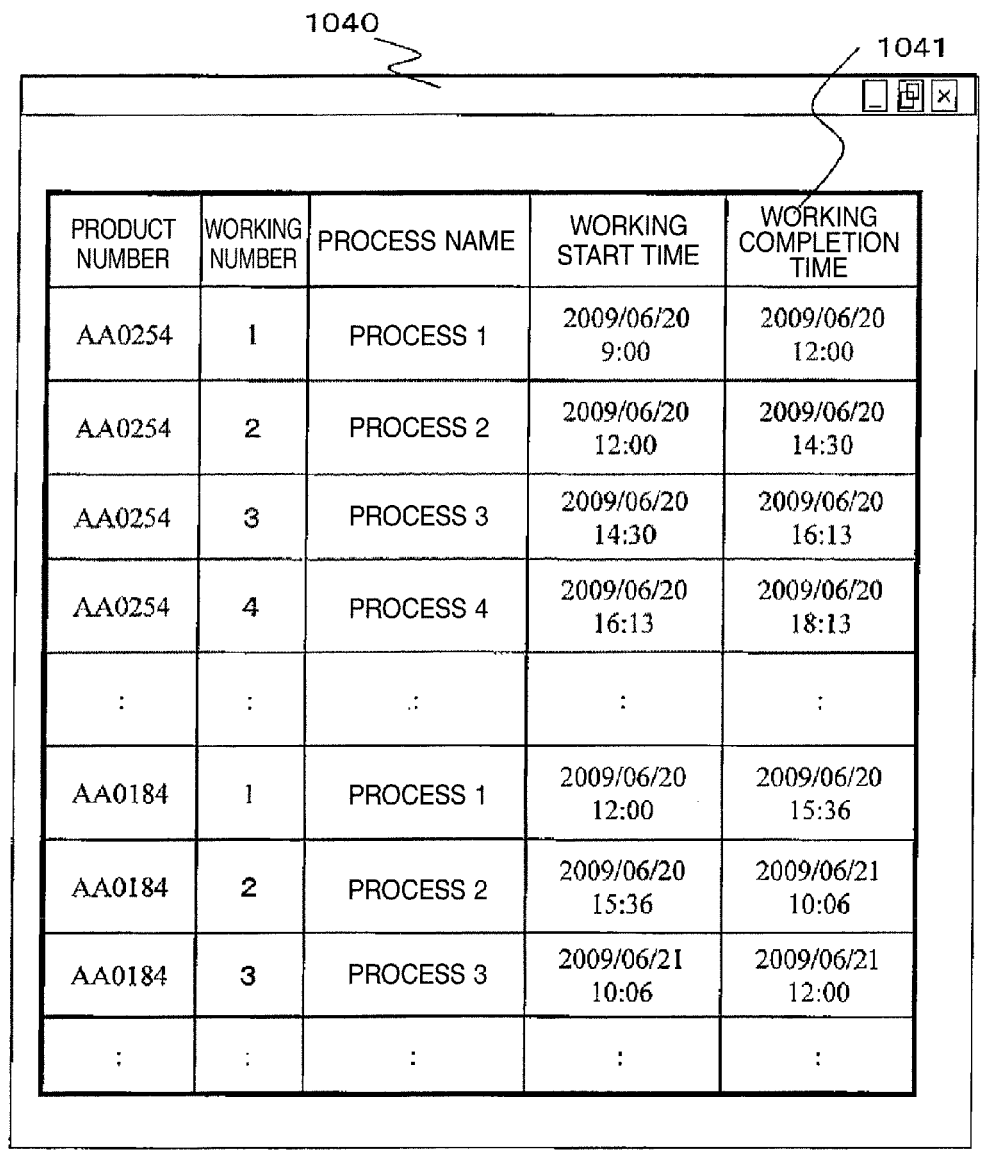
FIG. 22 shows an output result of a manufacturing line simulation input sequence creation device which is an embodiment of the present invention.

FIG. 22 is a schematic diagram showing an example of an output screen 1040. The output screen 1040 shows a simulation result of the manufacturing line design device 110. A display item 1041 includes a field for registering a product number which is an identification number allocated when an order is received from a delivery destination who is a customer, field for registering a working number in which the pertinent product number is currently in process, a field for registering a processing state of the pertinent product number, a field for registering facilities or a part storing place in which the pertinent product number is currently in process, a field for registering time when working is started in facilities or a part storing place in which the pertinent product number is currently in process, and a field for registering time when working is finished in facilities or a part storing place in which the pertinent product number is currently in process.

The invention claimed is:

1. A manufacturing line simulation device using a manufacturing line model, the manufacturing line simulation device comprising:
   a first storage unit for storing a plurality of model library items for creating the manufacturing line model;
   a second storage for storing a plurality of input items in the model library items;
   an input item association table for indicating a degree of overlapping between the plurality of input items of the model library items, wherein the degree of overlapping is defined in two stages with a weight according to an inclusion relation between the plurality of input items, and wherein the input item association table is a two-dimensional table and comprises table information on a first axis and each of the plurality of input items on a second axis with the degree of overlapping indicated at a corresponding crossing of the first axis and the second axis;
   a simulation library presentation unit for presenting the plurality of model library items stored in the first storage unit to a user and receive a specification of a model library item from the user;
   a priority impartment unit for calculating priorities of the plurality of input items using an input item association table stored in the first storage unit;
   presenting an input screen to the user on the basis of the calculated priorities;
   a simulation input reception unit for receiving a second input of at least one of the plurality of input items on the input screen;
   an overlapping data generation unit for duplicating data already received by the simulation input reception unit with respect to overlapping items shown in the input item association table;
   a simulation model generation unit for generating the manufacturing line model by using the specified model library item and an information value of the received second input which is received by the simulation input reception unit; and
   a production simulation execution unit for executing a simulation using the manufacturing line model.

2. The manufacturing line simulation device according to claim 1, wherein the priority impartment unit further rearranges the plurality of input items in order on the basis of the calculated priorities and presents a resultant input screen to the user.

3. The manufacturing line simulation device according to claim 1, wherein on the input screen, data duplicated by the overlapping data generation unit are presented on the input screen to the user in a state in which the data duplicated by the overlapping data generation unit are already input to corresponding input items.

4. The manufacturing line simulation device according to claim 1, wherein a degree of overlapping between input items shown in the input item association table is weighted in priority on the basis of an inclusion relation between input items.

5. The manufacturing line simulation device according to claim 1, wherein the priority impartment unit narrows down input items required for the simulation from among input items in accordance with the specified model library item, and presents resultant input items to the user.

6. A data input assistance device for assisting data input in a manufacturing line simulation using a manufacturing line model, the data input assistance device comprising:
   a first storage unit for storing a plurality of model library items for creating the manufacturing line model;
   a second storage unit for storing a plurality of input items in the model library items;
   an input item association table indicating a degree of overlapping between the plurality of input items in the model library items, wherein the degree of overlapping is defined in two stages with a weight according to an inclusion relation between the plurality of input items, and wherein the input item association table is a two-dimensional table and comprises table information on a first axis and each of the plurality of input items on a second axis with the degree of overlapping indicated at a corresponding crossing of the first axis and the second axis;
   a simulation library presentation unit for presenting the plurality of model library items stored in any of the first or second storage units to a user;
   receiving specification of a model library item from the user;
   a priority impartment unit for calculating priorities of the plurality of input items using an input item association table stored in either the first or second storage unit;
   presenting an input screen to the user on the basis of the calculated priorities;
   a simulation input reception unit for receiving a second input of at least one of the plurality of input items on the input screen;
   an overlapping data generation unit for duplicating data already received in the simulation input reception unit with respect to overlapping items shown in the input item association table;
   a simulation model generation unit for generating the manufacturing line model by using the specified model library item and an information value of the received second input which is received by the simulation input reception unit; and
   a production simulation execution unit for executing a simulation using the manufacturing line model.

7. The data input assistance device according to claim 6, wherein the priority impartment unit rearranges an order of the plurality of input items on the basis of the calculated priorities and presents a resultant input screen to the user.

8. The data input assistance device according to claim 6, wherein data duplicated by the overlapping data generation unit are presented to the user on the input screen in a state in which the data duplicated by the overlapping data generation unit is already input to corresponding input items.

9. The data input assistance device according to claim 6, wherein a degree of overlap between input items shown in the input item association table is weighted in priority on the basis of an inclusion relation between input items.

10. The data input assistance device according to claim 6, wherein the priority impartment unit narrows down input items for the simulation from among input items in accordance with the specified model library item, and presents resultant input items to the user.

11. A method for data input assistance in a manufacturing line simulation using a manufacturing line model, the method comprising:
   storing, via a first storage unit, a plurality of model library items for creating the manufacturing line model;
   storing, via a second storage unit, a plurality of input items in the model library items;
   indicating, via an input item association table, a degree of overlapping between the plurality of input items in the model library items, wherein the degree of overlapping is defined in two stages with a weight according to an inclusion relation between the plurality of input items, and wherein the input item association table is a two-dimensional table and comprises table information on a first axis and each of the plurality of input items on a second axis with the degree of overlapping indicated at a corresponding crossing of the first axis and the second axis;
   presenting, via a simulation library presentation unit, the plurality of model library items stored in a first storage unit to a user and receiving a specification of a model library item from the user;
   calculating, via a priority impartment unit, priorities of the plurality of input items using an input item association table stored in the first storage unit;
   presenting an input screen to the user on the basis of the calculated priorities;
   receiving, via a simulation input reception unit, a second input of at least one of the plurality of input items on the input screen;
   duplicating, via an overlapping data generation unit, data already received with respect to overlapping items shown in the input item association table;
   generating, via a simulation model generation unit, the manufacturing line model by using the specified model library item and an information value of the received second input; and
   executing, via a production simulation execution unit, a simulation using the manufacturing line model.

12. The method for data input assistance according to claim 11, wherein the input items are rearranged in order on the basis of the calculated priorities and presented to the user.

13. The method for data input assistance according to claim 11, wherein on the input screen, the duplicated data are presented to the user in a state in which the duplicated data are already input to corresponding input items.

14. The method for data input assistance according to claim 11, wherein a degree of overlapping between input items shown in the input item association table is weighted in priority on the basis of an inclusion relation between input items.

15. The method for data input assistance according to claim 11, wherein as for input items presented to the user, input items required for the simulation are narrowed in accordance with the specified model library item, and resultant input items are presented to the user.

* * * * *